(12) United States Patent
Murayama et al.

(10) Patent No.: US 7,622,854 B2
(45) Date of Patent: Nov. 24, 2009

(54) PIEZOELECTRIC ELEMENT AND FILM FORMATION METHOD FOR CRYSTALLINE CERAMIC

(75) Inventors: Manabu Murayama, Daito (JP); Shigeo Maeda, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 12/099,519

(22) Filed: Apr. 8, 2008

(65) Prior Publication Data

US 2008/0248324 A1 Oct. 9, 2008

(30) Foreign Application Priority Data

Apr. 9, 2007 (JP) .............................. 2007-101405

(51) Int. Cl.
*H01L 41/08* (2006.01)

(52) U.S. Cl. ....................................... 310/364; 310/363

(58) Field of Classification Search ................. 310/364, 310/320, 334
See application file for complete search history.

(56) References Cited

U.S. PATENT DOCUMENTS

| | | | | |
|---|---|---|---|---|
| 4,259,607 | A * | 3/1981 | Noguchi et al. | 310/364 |
| 7,235,917 | B2 * | 6/2007 | Fukui et al. | 310/364 |
| 7,262,544 | B2 * | 8/2007 | Aoki et al. | 310/363 |
| 7,265,483 | B2 * | 9/2007 | Takeda et al. | 310/364 |
| 7,276,836 | B2 * | 10/2007 | Umeda et al. | 310/320 |
| 7,291,960 | B2 * | 11/2007 | Iwashita et al. | 310/363 |

FOREIGN PATENT DOCUMENTS

| | | |
|---|---|---|
| JP | 5-214525 | 8/1993 |
| JP | 5-214526 | 8/1993 |
| JP | 8-157213 | 6/1996 |
| JP | 2002-185285 | 6/2002 |

OTHER PUBLICATIONS

Patent Abstracts of Japan for Japanese Publication No. 2002-185285, Publication date Jun. 28, 2002 (1 page).
Patent Abstracts of Japan for Japanese Publication No. 05-214525, Publication date Aug. 24, 1993 (1 page).
Patent Abstracts of Japan for Japanese Publication No. 05-214526, Publication date Aug. 24, 1993 (1 page).
Patent Abstracts of Japan for Japanese Publication No. 08-157213, Publication date Jun. 18, 1996 (1 page).

* cited by examiner

*Primary Examiner*—Mark Budd
(74) *Attorney, Agent, or Firm*—Osha • Liang LLP

(57) ABSTRACT

In a piezoelectric element having a substrate, a lower electrode layered on the substrate, a piezoelectric body made of ceramic layered on top of the lower electrode and an upper electrode layered on the piezoelectric body, wherein a first metal layer is provided between the substrate and the lower electrode, a second metal layer is provided between the lower electrode and the piezoelectric body, and the first metal layer and the second metal layer are made of a metal selected from among metals of which the ionization tendency is not less than that of Cu, oxides of metals of which the ionization tendency is not less than that of Cu, and alloys of metals of which the ionization tendency is not less than that of Cu.

8 Claims, 2 Drawing Sheets

1 PIEZOELECTRIC ELEMENT
7 UPPER ELECTRODE
6 PIEZOELECTRIC BODY
5 SECOND METAL LAYER
4 LOWER ELECTRODE
3 FIRST METAL LAYER
2 SUBSTRATE

PIEZOELECTRIC ELEMENT AND FILM FORMATION METHOD FOR CRYSTALLINE CERAMIC

BACKGROUND OF THE INVENTION

1. Field of the Invention

The present invention relates to a piezoelectric element having high adhesiveness and a film formation method for crystalline ceramic.

2. Description of the Related Art

There are many products where piezoelectric ceramic is applied, such as piezoelectric actuators serving as a mechanical drive source utilizing the inverse piezoelectric phenomenon of piezoelectric ceramic, ceramic filters utilizing resonance, and transducers. In piezoelectric ceramic, a dielectric body having a perovskite crystal structure is used.

For example, piezoelectric actuators are excellent in terms of precision of displacement, generative force and speed of response, and multilayer piezoelectric actuators are used for X-Y tables in semiconductor manufacturing apparatuses, precision processing, printer heads and optical devices etc.

Japanese Laid-Open Patent Publication No. 2002-185285 proposes a method according to which a piezoelectric thin film resonator having excellent adhesiveness to a substrate can be obtained by arranging an electrode film on a substrate via a $TiO_x$ ($0 \leq X \leq 2$) film which functions as an adhesive layer, and changing the value of X in sequence in the direction of the film thickness, toward the electrode film. Accordingly, the piezoelectric thin film resonator has a structure where a metal $TiO_x$ film is provided between a substrate and an electrode as an adhesive layer.

The metal $TiO_x$ film is formed in accordance with any of a vacuum deposition method, a magnetron sputtering method and a laser ablation method, so that the metal $TiO_x$ film is changed in sequence in the direction of the film thickness by carrying out heat treatment in an oxygen atmosphere or in normal atmosphere after formation of a metal Ti film.

Japanese Laid-Open Patent Publication No. 5 (1993)-214525 proposes a method for manufacturing a cathode target according to which the outer surface of a target holder in cylindrical form is processed to a rough surface, at least one layer from among layers made of a metal or an alloy having a coefficient of thermal expansion between that of a ceramic layer and that of a target, and layers made of a metal or an alloy having a coefficient of thermal expansion close to that of a ceramic layer is formed as an undercoating, and then a ceramic powder is plasma sprayed so that a ceramic layer is formed, and thus, a film of ceramic can be formed without requiring conventional equipment for manufacturing ceramic, and without a joining process. In this case, the ceramic powder is a powder containing at least one type from among Zr, Ti, Ta, Hf, Mo, W, Nb, Sn, La, In and Cr, and at least one type from among B, Si and O as main components, and the powder is amorphous ceramic.

Japanese Laid-Open Patent Publication No. 5 (1993)-214526 proposes a method to obtain a ceramic powder containing at least one type from among metals M (Zr, Ti, Ta, Hf, Mo, W, Nb, Sn, La, In and Cr) and Si as main components, and containing predetermined ratios of metals M as a total and Si, by using a method for manufacturing a cathode target similar to that of above-mentioned Japanese Laid-Open Patent Publication No. 5 (1993)-214525.

Japanese Laid-Open Patent Publication No. 8 (1996)-157213 proposes a configuration where a metal substrate, a metal layer, a ceramic buffer layer, a crystalline ceramic layer and an oxide superconductor layer are layered in sequence, and the ceramic buffer layer is made up of a lower amorphous ceramic layer and an upper crystalline ceramic layer, in order to obtain an oxide superconductor having excellent orientation and crystallinity.

SUMMARY OF THE INVENTION

In the piezoelectric thin film resonator described in Japanese Laid-Open Patent Publication No. 2002-185285, $TiO_2$ is formed between the lower electrode and the substrate. However, there is no adhesive layer between the lower electrode and the piezoelectric thin film. Therefore, the adhesiveness is inferior. Furthermore, in the case where expensive Pt is used for the electrodes, the cost increases.

In addition, though a piezoelectric thin film is formed between the electrodes, further increase in the adhesiveness is desired, in order to form a thick film.

In accordance with the method for manufacturing a cathode target described in Japanese Laid-Open Patent Publication No. 5 (1993)-214525, the ceramic layer is made of a powder containing at least one type from among Zr, Ti, Ta, Hf, Mo, W, Nb, Sn, La, In and Cr, and at least one type from among B, Si and O as main components, and thus, the ceramic is amorphous, and there is no mention of crystalline ceramic. In addition, sputtering methods are not appropriate for formation of a thick film.

In accordance with the method for manufacturing a cathode target described in Japanese Laid-Open Patent Publication No. 5 (1993)-214526 also, the ceramic layer contains at least one type from among Zr, Ti, Ta, Hf, Mo, W, Nb, Sn, La, In and Cr, and Si as main components, and thus, the ceramic is amorphous.

In the oxide superconductor described in Japanese Laid-Open Patent Publication No. 8 (1996)-157213, it is difficult to form a thick film in accordance with a sputtering method, and in addition, the subject is directed to improvement in the superconductive properties, not to improvement in the adhesiveness.

In view of the above-described situation, an object of the present invention is to provide a piezoelectric element where strong adhesiveness can be obtained between the piezoelectric ceramic and the substrate, irrespectively of whether the piezoelectric ceramic is a thin film or a thick film, as well as a film formation method for crystalline ceramic.

In order to achieve the above-described object, the present invention provides the following technical means.

The present invention provides a piezoelectric element having a substrate, a lower electrode layered on this substrate, a piezoelectric body made of ceramic layered on top of this lower electrode, and an upper electrode layered on this piezoelectric body, wherein a first metal layer is provided between the substrate and the lower electrode, a second metal layer is provided between the lower electrode and the piezoelectric body, and the first metal layer and the second metal layer are made of a metal selected from among metals of which the ionization tendency is not less than that of Cu, oxides of metals of which the ionization tendency is not less than that of Cu, and alloys of metals of which the ionization tendency is not less than that of Cu.

In this configuration, since the second metal layer is formed of a metal of which the ionization tendency is high, that is to say, a metal that is easily oxidized, for example Cu, Cr, Al or Ti, between the lower electrode and the piezoelectric body, oxygen bonding accelerates between the second metal layer and the piezoelectric body made of ceramic, and thus, the lower electrode and the piezoelectric body adhere naturally and firmly. Similarly, the first metal layer is provided between the lower electrode and the substrate, and thus the adhesion between the lower electrode and the substrate improves.

In the piezoelectric element according to the present invention, the first metal layer and the second metal layer may be made of a metal selected from among Ni, metals of which the ionization tendency is not less than that of Cr, oxides of Ni, oxides of metals of which the ionization tendency is not less than that of Cr, alloys of Ni, and alloys of metals of which the ionization tendency is not less than that of Cr.

In this configuration, since a metal having a particularly high ionization tendency, that is to say, a metal that is particularly easily oxidized, for example Ti, Cr or Ni, is used for the second metal layer, oxygen bonding accelerates between the second metal layer and the piezoelectric body made of ceramic, and thus, the lower electrode and the piezoelectric body adhere naturally and firmly. Similarly, the first metal layer is provided between the lower electrode and the substrate, and thus the adhesion between the lower electrode and the substrate improves.

In the piezoelectric element according to the present invention, it is preferable for the piezoelectric body to be formed as a film in accordance with any film forming method from among an aerosol deposition method, a gas deposition method, a screen printing method and a sputtering method.

The aerosol deposition method and the gas deposition method are appropriate for forming a thick film. In addition, the adhesion between the substrate and the piezoelectric ceramic is strong owing to the second metal layer made of a metal which is easily oxidized, even when the piezoelectric ceramic is a thick film, and thus, there is less peeling of the piezoelectric body. Furthermore, the adhesion between the substrate and the piezoelectric ceramic is strong even when the piezoelectric body is formed as a film in accordance with a screen printing method or a sputtering method, and the yield can be increased.

The film formation method for ceramic according to the present invention is a film formation method for crystalline ceramic according to which a metal layer is layered on a substrate and crystalline ceramic is layered on the metal layer, and the metal layer is made of a metal selected from among metals of which the ionization tendency is not less than that of Cu, oxides of metals of which the ionization tendency is not less than that of Cu, and alloys of metals of which the ionization tendency is not less than that of Cu.

According to this film formation method, since a metal layer is formed of a metal having a high ionization tendency, that is to say, a metal that is easily oxidized, for example Cu, Cr, Al or Ti, between the substrate and the crystalline ceramic, adhesion can be secured between the metal layer and the substrate, and oxygen bonding accelerates between the metal and the crystalline ceramic, and thus the substrate and the crystalline ceramic adhere naturally and firmly.

In accordance with the film formation method for crystalline ceramic according to the present invention, the metal layer may be made of a metal selected from among Ni, metals of which the ionization tendency is not less than that of Cr, oxides of Ni, oxides of metals of which the ionization tendency is not less than that of Cr, alloys of Ni, and alloys of metals of which the ionization tendency is not less than that of Cr.

In accordance with this film formation method, since a metal layer is formed of a metal having a particularly high ionization tendency, that is to say, a metal that is particularly easily oxidized, for example Ti, Cr or Ni, between the substrate and the crystalline ceramic, adhesion can be secured between the metal layer and the substrate, and oxygen bonding accelerates between the metal and the crystalline ceramic, and thus, the substrate and the crystalline ceramic adhere naturally and firmly.

In accordance with the film formation method for crystalline ceramic according to the present invention, it is preferable for the crystalline ceramic to be formed as a film in accordance with any film formation method from among an aerosol deposition method, a gas deposition method, a screen printing method and a sputtering method.

Even when a thick film is formed in accordance with an aerosol deposition method or a gas deposition method, the adhesion between the substrate and the crystalline ceramic is strong, because the metal layer is formed of a metal having a high ionization tendency, that is to say, a metal which is easily oxidized, for example Ti, Cr or Ni. In addition, though the crystalline ceramic may peel when a thin film is formed in accordance with a screen printing method or a sputtering method, the adhesion improves when a metal layer is formed of a metal which is easily oxidized, for example Ti or Cr, between the substrate and the crystalline ceramic, as described above.

According to the present invention, a piezoelectric element where the adhesion between the piezoelectric ceramic and the substrate is strong, irrespectively of whether the piezoelectric ceramic is a thin film or a thick film, as well as a film formation method for crystalline ceramic, can be obtained.

DESCRIPTION OF THE PREFERRED EMBODIMENTS

In the following, embodiments of the present invention are described in reference to the drawings.

Figure 1:
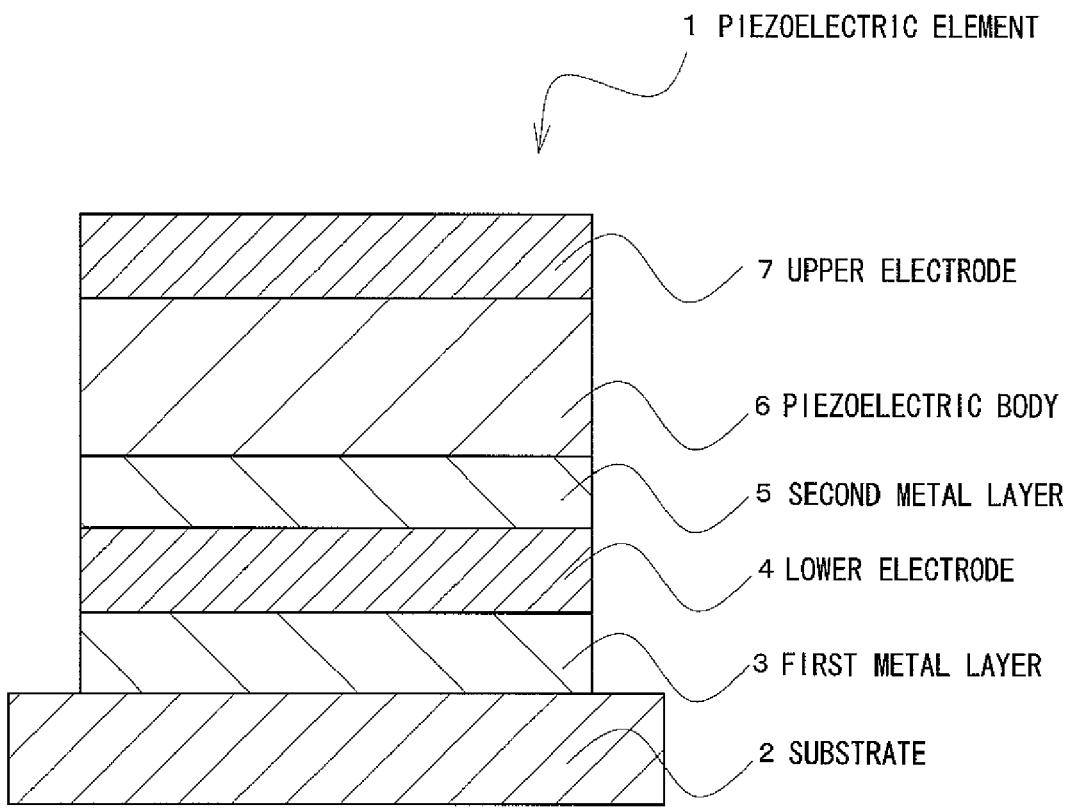
FIG. 1 is a diagram showing a piezoelectric element according to a first embodiment.

FIG. 1 is a diagram showing a piezoelectric element according to a first embodiment of the present invention.

A piezoelectric element 1 has a first metal layer 3 between a substrate 2 made of, for example, Si or $SiO_2$, and a lower electrode 4. The first metal layer 3 is made of a metal having a high ionization tendency, for example Ti. When a layer of Ti, which is a metal having a high ionization tendency and is easily oxidized, is formed between the substrate 2 and the lower electrode 4 as described above, the adhesion between the substrate 2 and the lower electrode 4 improves.

Furthermore, a second metal layer 5 is provided between the lower electrode 4 and a piezoelectric body 6. The second metal layer 5 is also made of Ti. Since Ti has a high ionization tendency and is easily oxidized, bonding is accelerated between the second metal layer 5 and the piezoelectric body 6 through oxidation, and thus the second metal layer 5 and the piezoelectric body 6 adhere naturally and firmly.

As described above, the metal used for the first metal layer 3 and the second metal layer 5 is a metal that is easily oxidized, that is to say, a metal having a high ionization tendency. Concretely, this metal having a high ionization tendency is a metal of which the ionization tendency is not less than that of Cu, an oxide of a metal of which the ionization tendency is not less than that of Cu, or an alloy of a metal of which the ionization tendency is not less than that of Cu. In this case, Ni, which is a metal having a higher ionization tendency, an oxide of Ni or an alloy of Ni is desirable, and a metal of which the ionization tendency is not less than that of Cr, an oxide of a metal of which the ionization tendency is not less than that of Cr, or an alloy of a metal of which the ionization tendency is not less than that of Cr is more desirable.

Furthermore, an upper electrode 7 is formed as a film in a layer above the piezoelectric body 6, so that the piezoelectric body 6 is sandwiched between the upper electrode 7 and the lower electrode 4.

The piezoelectric body 6 has positive piezoelectric effects where charge is generated in the crystal by applying force or causing distortion, and inverse piezoelectric effects where force or distortion is generated when an electrical field is applied to the crystal. Therefore, the piezoelectric element 1 can be used as an actuator by applying a voltage across the electrodes 4 and 7 or, conversely, as a pressure sensor, by measuring the voltage across the electrodes 4 and 7.

As the piezoelectric body 6, PZT (lead zirconate titanate, $Pb(Zi, Ti)O_3$), for example, which is piezoelectric ceramic, is used. PZT is a ferroelectric substance having a perovskite crystal structure which can be represented by a general composition formula $ABO_3$, and is widely used as a piezoelectric material for actuators and sensors etc. In addition, in the case where PZT is used as a thin film, it can also be used for nonvolatile memories, piezoelectric devices and optical devices.

As the piezoelectric body 6, barium titanate ($BaTiO_3$) can be used. Barium titanate also has a perovskite crystal structure.

In addition to the above, lead titanate ($PbTiO_3$), PLZT (lead lanthanum zirconate titanate, $(Pb, La) (Zr, Ti)O_3$) where a small amount of La is added to PZT and the like can be used as piezoelectric ceramic having a perovskite crystal structure.

Al, for example, is used for the electrodes i.e. the upper electrode 7 and the lower electrode 4. Since expensive Pt is not used for the upper electrode 7 and the lower electrode 4, the cost can be reduced. In place of Al, Cu, for example, can be used. Since Cu is also less expensive than Pt, the cost can be reduced.

The piezoelectric body 6 provides piezoelectric properties when a polarization process is carried out on a dielectric body.

Figure 2:
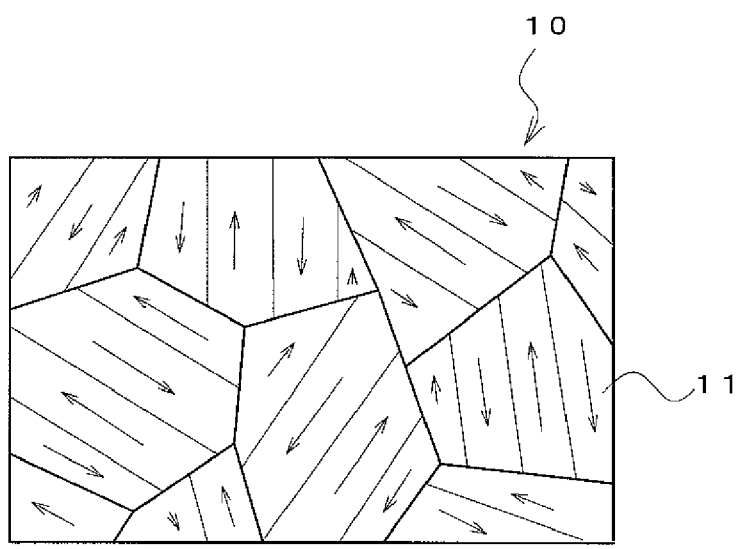
FIG. 2 is a diagram showing spontaneous polarization in dielectric ceramic before application of an electrical field.
Figure 3:
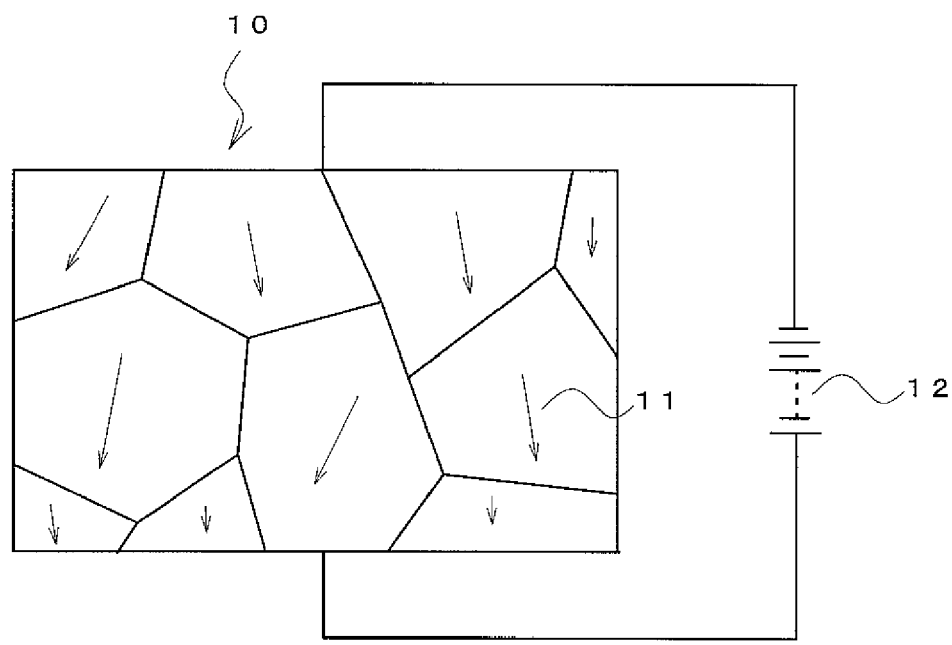
FIG. 3 is a diagram showing spontaneous polarization in dielectric ceramic after application of an electrical field.

FIG. 2 is a diagram showing spontaneous polarization of dielectric ceramic before application of an electrical field, and FIG. 3 is a diagram showing spontaneous polarization of dielectric ceramic after application of an electrical field.

In general, in dielectric ceramic 10 having a perovskite crystal structure, as shown in FIG. 2, crystal grains 11 are spontaneously polarized in random directions, and even when a microscopic electrical field is applied in this state, distortion is offset between the crystal grains 11, and thus, no piezoelectric properties are exhibited.

As shown in FIG. 3, however, when a polarization process (poling) is carried out by applying an intense direct current electrical field 12 of several kv/mm, the directions of spontaneous polarization become uniform. Thus, even when the direct current electrical field 12 is removed from the polarized dielectric ceramic 10, the state where the directions of spontaneous polarization of crystal grains 11 are uniform is maintained.

The dielectric ceramic 10 has piezoelectric properties after polarization, and when a microscopic electrical field is applied, distortion is not offset between the crystal grains 11 and the dielectric ceramic 10 is deformed. Here, the microscopic electrical field does not change the directions of spontaneous polarization, and the state where the directions are uniform is maintained.

In PZT, a piezoelectric constant varies depending on a direction of orientation of the dielectric ceramic film. Controlling the orientation of the PZT film is required in order to reduce a dispersion of the piezoelectric constant of the PZT film.

Therefore, self-oriented Pt where the directions of the crystal easily become uniform is conventionally used for the lower electrode 4 and the upper electrode 7. In the present embodiment, however, the directions of the crystal become sufficiently uniform and excellent piezoelectric properties can be obtained by carrying out a polarization process as described above, and thus the cost can be lowered by not using expensive Pt.

The dielectric body 6 is formed as a film in accordance with an aerosol deposition method (AD method). The AD method is a method for film formation according to which ceramic microscopic particles are mixed with a gas and sprayed aobtainst the substrate 2 at high speed without application of heat, and thus, a strong ceramic film with high density can be fabricated, simply as a result of collision of ceramic particles.

The ceramic particles are crushed into extremely small microscopic particles on a nano millimeter scale at the time of collision, and thus, the surface cracks at the time of collision, so that an active surface is created and bonding is caused between particles.

Accordingly, the constitution of the crystal is created without sintering, and the risk of other films being negatively affected is low.

Furthermore, the aerosol deposition method is appropriate for formation of a thick film. As described above, according to the present embodiment, adhesion between the substrate 2 and the lower electrode 4, as well as that between the lower electrode 4 and the piezoelectric body 6, respectively increases. Thus, by using this advantage effectively, films of various thicknesses, from thin films of several μm to thick films of several tens of μm, can be formed.

Here, a thick film can be formed as the piezoelectric body 6 in accordance with a gas deposition method instead of an aerosol deposition method.

In addition, the piezoelectric body 4 may be formed as a film in accordance with various types of sputtering methods such as direct current sputtering and high-frequency sputtering, or screen printing, depending on the conditions of use.

In sputtering, ceramic particles are used as a target, and an inert gas is ionized, so that the inert gas collides with the target in a vacuum, and ceramic particles separated from the target as a result of collision adhere to the substrate 2 (first metal layer 3) so that a thin film is formed.

In screen printing, a screen made of a mesh and a mask is pressed against the substrate 2 (first metal layer 3) so that ceramic particles are applied to the substrate, and thus, a piezoelectric body 6 is formed.

As for the pattern of the piezoelectric body 6 formed as a film, the film may be formed throughout the entirety on the surface of the substrate 2, as if painted solid, but appropriate changes can be made in the form, for example the pattern may be a grid or an irregular pattern, depending on the application and the state of use of the piezoelectric element 1.

Films other than the piezoelectric body 6, such as electrodes, are formed through sputtering.

Appropriate changes may be made in the form and the thickness of the film of the lower electrode 4 and the upper electrode 7, as with the piezoelectric body 6, depending on the application and the state of use of the piezoelectric element 1.

The lower electrode 4 may lead out from an end portion of the piezoelectric element 1 or lead out from the center portion.

As described above, according to the present embodiment, there is a second metal layer 5 made of a metal that is easily oxidized between the piezoelectric body 6 and the lower electrode 4. Therefore, even in the case where the piezoelectric body 6 is a thick film, bonding accelerates between the piezoelectric body 6 and the lower electrode 4 through oxidation, so that the piezoelectric body 6 and the lower electrode 4 adhere naturally and firmly. Thus, there is less peeling of the piezoelectric element 1, thereby a piezoelectric element 1 having high performance can be obtained.

Furthermore, because expensive Pt is not used for the lower electrode 4 and the upper electrode 7, the cost of the piezoelectric element 1 lowers. Here, the metal used for the first metal layer 3 and the second metal layer 5 is a metal that is oxidized more easily (a metal having a higher ionization tendency) than the metal used for the lower electrode 4. When a metal that is oxidized more easily (a metal having a higher ionization tendency) than the lower electrode 4 is used for the first metal layer 3 and the second metal layer 5, bonds are created between the substrate 2 and the first metal layer 3, between the first metal layer 3 and the lower electrode 4, between the lower electrode 4 and the second metal layer 5, and between the second metal layer 5 and the piezoelectric body 6 through oxidation, so that the substrate 2 and the lower electrode 4, as well as the lower electrode 4 and the piezoelectric body 6, adhere firmly.

Figure 4:
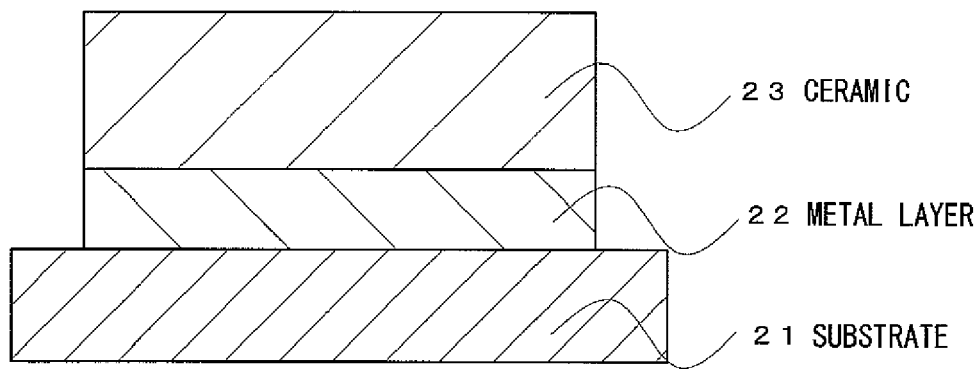
FIG. 4 is a diagram showing a substrate where ceramic is formed as a film according to a second embodiment.

FIG. 4 is a diagram showing a substrate on which crystalline ceramic is formed as a film according to a second embodiment of the present invention.

As shown in FIG. 4, in the second embodiment, a metal layer 22 is provided between a substrate 21 and ceramic 23.

The substrate 21 is made of, for example, Si or $SiO_2$, and as the ceramic 23, crystalline ceramic, for example PZT having a perovskite structure, as described above, barium titanate or a magnetic substance such as of ferrite, is used.

In addition, Ti, which is a metal that is easily oxidized, is used for the metal layer 22 between the substrate 21 and the ceramic 23.

Since a metal that is easily oxidized, that is to say, a metal having a high ionization tendency, is formed as a film between the substrate 21 and the ceramic 23, adhesion can be secured between the substrate 21 and the metal layer 22, and also bonding accelerates between the metal layer 22 and the ceramic 23 through oxidation. Consequently, the metal layer 22 and the ceramic 23, thus the substrate 21 and the ceramic 23, adhere naturally and firmly.

An oxide of Ti or an alloy of Ti can also be used for the metal layer 22. When such a metal is used, bonding accelerates between the metal layer 22 and the ceramic 23 through oxidation, so that the metal layer 22 and the ceramic 23, thus the substrate 21 and the ceramic 23, adhere naturally and firmly. The metal used for the metal layer 22 may be any metal from among metals of which the ionization tendency is not less than that of Cu, oxides of metals of which the ionization tendency is not less than that of Cu, and alloys of metals of which the ionization tendency is not less than that of Cu. In this case, Ni, which is a metal having higher ionization tendency, an oxide of Ni or an alloy of Ni is desirable, and a metal of which the ionization tendency is not less than that of Cr, an oxide of metals of which the ionization tendency is not less than that of Cr, or an alloy of metals of which the ionization tendency is not less than that of Cr is more desirable.

The ceramic 23 can be formed as a thick film in accordance with an aerosol deposition method or a gas deposition method, and strong adhesion in the present embodiment can be effectively used. The metal layer 22 is formed by sputtering. The ceramic 23 may be formed as a film in accordance with a screen printing method or a sputtering method.

Appropriate changes can, of course, be made in the form and structure of the above-described ceramic and the like, depending on the conditions and the application etc.

What is claimed is:

1. A piezoelectric element, comprising: a substrate; a lower electrode layered on said substrate; a piezoelectric body made of ceramic layered on top of said lower electrode; and an upper electrode layered on said piezoelectric body, wherein
   a first metal layer is provided between said substrate and said lower electrode,
   a second metal layer is provided between said lower electrode and said piezoelectric body, and
   said first metal layer and said second metal layer are made of a metal selected from among metals of which the ionization tendency is not less than that of Cr, oxides of metals of which the ionization tendency is not less than that of Cr and alloys of metals of which the ionization tendency is not less than that of Cr.

2. The piezoelectric element according to claim 1, wherein said first metal layer and said second metal layer are made of a metal selected from among Ni, oxides of Ni, and alloys of Ni.

3. The piezoelectric element according to claim 1, wherein said piezoelectric body is formed as a film in accordance with any film formation method from among an aerosol deposition method, a gas deposition method, a screen printing method and a sputtering method.

4. A film formation method for crystalline ceramic according to which a metal layer is layered on a substrate and crystalline ceramic is layered on said metal layer, wherein
   said metal layer is made of a metal selected from among metals of which the ionization tendency is not less than that of Cr, oxides of metals of which the ionization tendency is not less than that of Cr, and alloys of metals of which the ionization tendency is not less than that of Cr.

5. The film formation method for crystalline ceramic according to claim 4, wherein said metal layer is made of a metal selected from among Ni, oxides of Ni, and alloys of Ni.

6. The film formation method for crystalline ceramic according to claim 4, wherein said crystalline ceramic is formed as a film in accordance with any film formation method from among an aerosol deposition method, a gas deposition method, a screen printing method and a sputtering method.

7. The piezoelectric element according to claim 2, wherein said piezoelectric body is formed as a film in accordance with any film formation method from among an aerosol deposition method, a gas deposition method, a screen printing method and a sputtering method.

8. The film formation method for crystalline ceramic according to claim 5, wherein said crystalline ceramic is formed as a film in accordance with any film formation method from among an aerosol deposition method, a gas deposition method, a screen printing method and a sputtering method.

* * * * *